US011863142B2

(12) United States Patent
Livoti et al.

(10) Patent No.: US 11,863,142 B2
(45) Date of Patent: Jan. 2, 2024

(54) METHODS AND APPARATUS TO DETERMINE AUTOMATED GAIN CONTROL PARAMETERS FOR AN AUTOMATED GAIN CONTROL PROTOCOL

(71) Applicant: The Nielsen Company (US), LLC, New York, NY (US)

(72) Inventors: John T. Livoti, Clearwater, FL (US); Rajakumar Madhanganesh, Tampa, FL (US); Stanley Wellington Woodruff, Palm Harbor, FL (US); Ryan C. Lehing, Oldsmar, FL (US); Charles Clinton Conklin, New Port Richey, FL (US)

(73) Assignee: NIELSEN COMPANY (US) LLC, New York, NY (US)

( * ) Notice: Subject to any disclaimer, the term of this patent is extended or adjusted under 35 U.S.C. 154(b) by 35 days.

(21) Appl. No.: 17/485,012

(22) Filed: Sep. 24, 2021

(65) Prior Publication Data

US 2022/0190799 A1    Jun. 16, 2022

Related U.S. Application Data

(63) Continuation of application No. 16/452,489, filed on Jun. 25, 2019, now Pat. No. 11,133,787.

(51) Int. Cl.
*H03F 3/191* (2006.01)
*H03G 3/30* (2006.01)
*H04B 1/10* (2006.01)

(52) U.S. Cl.
CPC .............. *H03G 3/30* (2013.01); *H04B 1/109* (2013.01); *H03G 3/3042* (2013.01)

(58) Field of Classification Search
CPC ...... H03G 3/30; H03G 3/3042; H03G 3/3005; H03G 3/20; H03G 3/3089; H03G 3/005;
(Continued)

(56) References Cited

U.S. PATENT DOCUMENTS 6,191,725 B1    2/2001  Lavoie
7,245,638 B2    7/2007  Agazzi et al.
(Continued)

OTHER PUBLICATIONS

United States Patent and Trademark Office, "Non-Final Office Action," issued in connection with U.S. Appl. No. 16/452,489, dated Nov. 16, 2020, 6 pages.
(Continued)

*Primary Examiner* — Khanh V Nguyen

(57) ABSTRACT

Methods and apparatus to determine automated gain control parameters for an automated gain control protocol are disclosed. An example apparatus includes a first tuner to amplify an audio signal. Disclosed example apparatus also include a second tuner to amplify the audio signal. Disclosed example apparatus also include a first controller to tune the first tuner to apply a first gain representative of a first range of gains to the audio signal to determine a first amplified audio signal and tune the second tuner to apply a second gain representative a second range of gains to the audio signal to determine a second amplified audio signal, the second range of gains lower than the first range of gains. Disclosed example apparatus also include a second controller to select the first range of gains to be utilized in an automated gain control protocol when the first gain results in clipping of the first amplified audio signal and the second gain does not result in clipping of the second amplified audio signal.

20 Claims, 5 Drawing Sheets

(58) Field of Classification Search
CPC ... H03G 5/005; H03G 5/16; H03G 5/00; H03G 5/02; H04B 1/109; H04R 2430/01
See application file for complete search history.

(56) References Cited

U.S. PATENT DOCUMENTS

| | | | |
|---|---|---|---|
| 8,290,181 B2 * | 10/2012 | Stokes, III | H03G 3/301 381/104 |
| 8,339,202 B2 | 12/2012 | Smith | |
| 8,392,180 B1 | 3/2013 | Lachapelle et al. | |
| 8,538,749 B2 | 9/2013 | Visser et al. | |
| 8,731,210 B2 | 5/2014 | Cheng et al. | |
| 9,065,525 B1 | 6/2015 | Yosoku et al. | |
| 9,699,549 B2 | 7/2017 | Pandya et al. | |
| 10,277,183 B2 | 4/2019 | Cohrs | |
| 10,867,617 B1 | 12/2020 | Nakagawa et al. | |
| 11,019,301 B2 * | 5/2021 | Livoti | H04N 21/8106 |
| 11,133,787 B2 | 9/2021 | Livoti et al. | |
| 2005/0128362 A1 | 6/2005 | Teichner et al. | |
| 2006/0210096 A1 | 9/2006 | Stokes, III et al. | |
| 2008/0012990 A1 | 1/2008 | Kitamura et al. | |
| 2009/0220109 A1 | 9/2009 | Crockett et al. | |
| 2011/0193625 A1 | 8/2011 | Gatta et al. | |
| 2011/0243038 A1 | 10/2011 | Challa et al. | |
| 2013/0243227 A1 | 9/2013 | Kinsbergen et al. | |
| 2014/0144233 A1 | 5/2014 | Kim et al. | |
| 2014/0369521 A1 | 12/2014 | Bongiovi et al. | |
| 2016/0173808 A1 | 6/2016 | Reams | |
| 2022/0200556 A1 | 6/2022 | Livoti et al. | |

OTHER PUBLICATIONS

United States Patent and Trademark Office, "Notice of Allowance and Fee(s) Due," issued in connection with U.S. Appl. No. 16/452,489, dated May 26, 2021, 5 pages.

International Searching Authority, "International Preliminary Report on Patentability," issued in connection with PCT Application No. PCT/US2020/038193, dated Dec. 28, 2021, 6 pages.

International Searching Authority, "Search Report and Written Opinion," issued in connection with PCT Application No. PCT/US2020/038193, dated Sep. 25, 2020, 8 pages.

* cited by examiner

METHODS AND APPARATUS TO DETERMINE AUTOMATED GAIN CONTROL PARAMETERS FOR AN AUTOMATED GAIN CONTROL PROTOCOL

RELATED APPLICATION

This patent arises from a continuation of U.S. patent application Ser. No. 16/452,489 (now U.S. Pat. No. 11,133,787), which was filed on Jun. 25, 2019. U.S. patent application Ser. No. 16/452,489 is hereby incorporated herein by reference in its entirety. Priority to U.S. patent application Ser. No. 16/452,489 is hereby claimed.

FIELD OF THE DISCLOSURE

This disclosure relates generally to audio signal recovery and, more particularly, to methods and apparatus to determine automated gain control parameters for an automated gain control protocol.

BACKGROUND

Media monitoring meters are used in homes and other locations to determine exposure to media (e.g., audio media and/or video media) output by media output devices. Such media output devices include televisions, radios, computers, tablets, and/or any other device capable of outputting media. In some examples, an audio component of the media is encoded with a watermark (e.g., a code) that includes data related to the media. In such examples, when the meter receives the media, the meter extracts the watermark to identify the media. Additionally, the meter transmits the extracted watermark to an audience measurement entity to monitor media exposure. In some examples, the meter generates a signature or fingerprint of the media based on the characteristics of the audio component of the media. In such examples, the meter transmits the signature to the audience measurement entity. The audience measurement entity compares the generated signature to stored reference signatures in a database to identify a match, thereby identifying the media. The audience measurement entity monitors media exposure based on a match between the generated signature and a reference signature.

BRIEF DESCRIPTION OF THE DRAWINGS

The figures are not to scale. Wherever possible, the same reference numbers will be used throughout the drawing(s) and accompanying written description to refer to the same or like parts.

Figure 1:
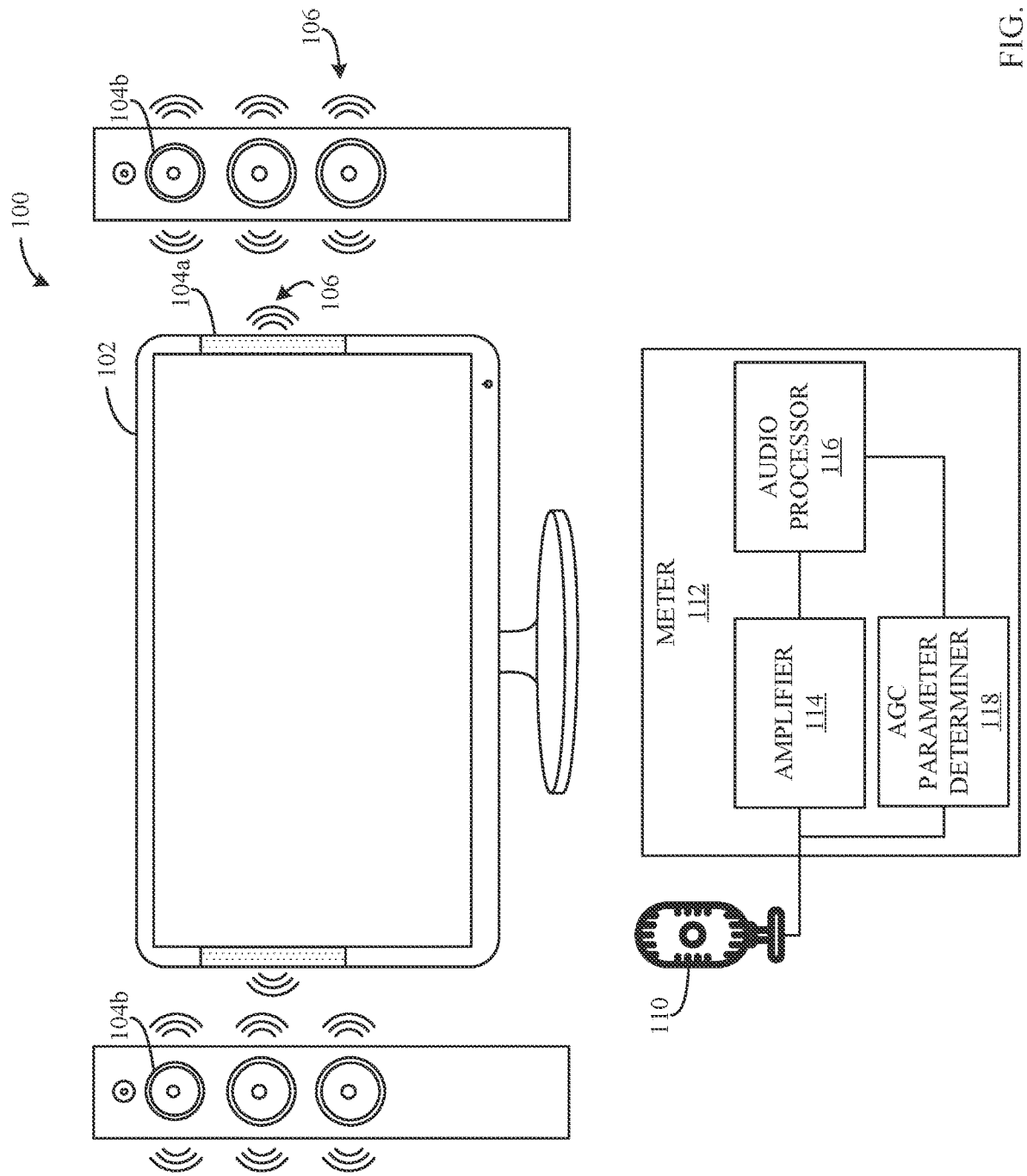
FIG. 1 is an illustration of an example environment for selecting AGC parameters of an AGC protocol using parallel tuners in accordance with teachings of this disclosure.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components

DETAILED DESCRIPTION

When a panelist signs up to have their exposure to media monitored by an audience measurement entity, the audience measurement entity sends a technician to the home of the panelist to install a meter (e.g., a media monitor) capable of gathering media exposure data from a media output device(s) (e.g., a television, a radio, a computer, etc.). Generally, the meter includes or is otherwise connected to a microphone and/or a magnetic-coupling device to gather ambient audio. In this manner, when the media output device is "on," the microphone may receive an acoustic signal transmitted by the media output device. As further described below, the meter may extract audio watermarks from the acoustic signal to identify the media. Additionally or alternatively, the meter may generate signatures and/or fingerprints based on the media. The meter transmits data related to the watermarks and/or signatures to the audience measurement entity to monitor media exposure. Examples disclosed herein relate to efficiently selecting a desirable gain to amply a received signal at a meter prior to processing the audio.

Audio watermarking is a technique used to identify media such as television broadcasts, radio broadcasts, advertisements (television and/or radio), downloaded media, streaming media, prepackaged media, etc. Existing audio watermarking techniques identify media by embedding one or more audio codes (e.g., one or more watermarks), such as media identifying information (e.g., herein information and/or data) and/or an identifier that may be mapped to media identifying information, into an audio and/or video component. In some examples, the audio or video component is selected to have a signal characteristic sufficient to mask the watermark. As used herein, the terms "code" or "watermark" are used interchangeably and are defined to mean any identification information (e.g., an identifier) that may be inserted or embedded in the audio or video of media (e.g., a program or advertisement) for the purpose of identifying the media or for another purpose such as tuning (e.g., a packet identifying header). As used herein "media" refers to audio and/or visual (still or moving) content and/or advertisements. To identify watermarked media, the watermark(s) are extracted and used to access a table of reference watermarks that are mapped to media identifying information.

Unlike media monitoring techniques based on codes and/or watermarks included with and/or embedded in the monitored media, signature or fingerprint-based media monitoring techniques generally use one or more inherent characteristics of the monitored media during a monitoring time interval to generate a substantially unique proxy for the media. Such a proxy is referred to as a signature or fingerprint, and can take any form (e.g., a series of digital values, a waveform, etc.) representative of any aspect(s) of the media signal(s) (e.g., the audio and/or video signals forming the media presentation being monitored). A signature may be a series of signatures collected in series over a time interval. A good signature is repeatable when processing the same media presentation, but is unique relative to other (e.g., different) presentations of other (e.g., different) media. Accordingly, the term "signature" and "fingerprint" are used interchangeably herein and are defined herein to mean a proxy for identifying media that is generated from one or more inherent characteristics of the media.

Signature-based media monitoring generally involves determining (e.g., generating and/or collecting) signature(s) representative of a media signal (e.g., an audio signal and/or a video signal) output by a monitored media device and comparing the monitored signature(s) to one or more references signatures corresponding to known (e.g., reference) media sources. Various comparison criteria, such as a cross-correlation value, a Hamming distance, etc., can be evaluated to determine whether a monitored signature matches a particular reference signature. When a match between the monitored signature and one of the reference signatures is found, the monitored media can be identified as corresponding to the particular reference media represented by the reference signature that matched the monitored signature. Because attributes, such as an identifier of the media, a presentation time, a broadcast channel, etc., are collected for the reference signature, these attributes may then be associated with the monitored media whose monitored signature matched the reference signature. Example systems for identifying media based on codes and/or signatures are long known and were first disclosed in Thomas, U.S. Pat. No. 5,481,294, which is hereby incorporated by reference in its entirety.

When a meter senses audio via a sensor (e.g., microphone), the meter uses an amplifier to amplify the sensed audio signal prior to processing the audio signal to generate signatures and/or extract watermarks. The amount of gain (e.g., amplification) used by the amplifier corresponds to the accuracy of signature generation and/or watermark extraction. For example, when the volume of audio output by an media presentation device is low, the gain should be a high gain to successfully generate a signature and/or extract a watermark. However, when the volume of the audio output by the media presentation device is high, applying a high gain will result in undesired clipping of the audio, leading to inaccurate signatures and/or watermark extraction failures.

Automated gain control (AGC) protocols can be implemented to automatically determine a satisfactory (e.g., optimal) gain level to utilize in the amplifier of a meter that allows the meter to successfully generate signatures and/or extract watermarks without clipping the audio signal. An AGC protocol adjusts the gain within a range of gain levels to attempt to select the highest gain that does not clip the signal. For example, an AGC protocol may ramp down from the highest gain of the range to a gain at which clipping ceases. Once the meter determines that clipping has ceased, the meter utilizes the gain (e.g., locks the gain) at which clipping ceases for processing audio until the AGC protocol is rerun (e.g., after a duration of time, after a triggering event, etc.).

Traditional AGC protocols test the same range of gains each time the protocol is triggered. For example, if the AGC protocol starts at the highest gain (100 decibels (dB)) of an amplifier and ramps down to the lowest gain (e.g., 5 dB) of an amplifier, every time the AGC protocol is run the amplifier will start at the highest gain or the lowest gain and ramp down or up until the highest (e.g., or a sufficiently high) gain level is obtained that does not cause clipping. For example, an AGC protocol may start at 100 dB (e.g., the maximum gain, where clipping typically occurs) and quickly ramp the gain down until clipping ceases, and once clipping ceases, the gain level is slowly ramped up to identify the highest gain that does not result in clipping. However, audio that is played loudly will require less gain. Accordingly, a traditional AGC protocol wastes time and resources by starting at the maximum gain of an amplifier when the audio is loud or starting at a minimum gain of an amplifier when the audio is low. Examples disclosed herein perform an AGC parameter protocol (e.g., prior to a AGC protocol) to reduce the range of gain levels to be used in the AGC protocol.

The example AGC parameter protocols disclosed herein utilize multiple tuners in parallel to identify a smaller range of gain levels within which the border between clipping and no clipping occurs. For example, if the full range of gains for a conventional AGC protocol is 100 dB to 0 dB, one example disclosed AGC parameter protocol may control four tuners to split the full range of gains into 4 subranges (e.g., 100-76 dB, 75-51 dB, 50-26 dB, 25-0 dB) and determine the highest range where clipping occurs. In such an example, if the highest range where clipping occurs is 75-51 dB, then somewhere within that range exists the border between clipping and no clipping (e.g., the optimal gain level). Accordingly, the AGC protocol can be performed within the 75-51 dB range, reducing the time and amount of resources that would be required to perform a conventional AGC protocol (e.g., from 100-0 dB).

FIG. 1 illustrates an example environment 100 for selecting AGC parameters for an AGC protocol based on historic data in accordance with teachings of this disclosure. The example environment 100 of FIG. 1 includes an example media output device 102, example speakers 104a, 104b, an example audio signal 106, an example microphone 110, and an example meter 112. The example meter 112 includes an example amplifier 114, an example audio processor 116, and an example AGC parameter determiner 118.

The example media output device 102 of FIG. 1 is a device that outputs media. Although the example media output device 102 of FIG. 1 is illustrated as a television, the example media output device may be a radio, an MP3 player, a video game counsel, a stereo system, a mobile device, a computing device, a tablet, a laptop, a projector, a DVD player, a set-top-box, an over-the-top device, and/or any device capable of outputting media. The example media output device may include speakers 104a and/or may be coupled, or otherwise connected to portable speakers 104b via a wired or wireless connection. The example speakers 104a, 104b output the audio portion of the media output by the example media output device.

The example microphone 110 of FIG. 1 is an audio sensor that receives the example audio signal 106 (e.g., as part of a sensing of ambient sound). The microphone 110 converts the example audio signal 106 into an electrical signal representative of the audio signal. The example microphone 110 transmits the electrical signal to the example amplifier 114 of the example meter 112. The example amplifier 114 amplifies the electrical signal so that the meter 112 can generate signatures and/or extract watermarks based on the amplified electrical signal, as further described below.

The example meter 112 of FIG. 1 is a device installed in a location of a panelist that monitors exposure to media from the example media output device 102. Panelists are users included in panels maintained by a ratings entity (e.g., an audience measurement company) that owns and/or operates the ratings entity subsystem. The example meter 112 may extract watermarks and/or generate signatures from media output by the example media output device 102 to identify the media. The example meter 112 is coupled or otherwise connected to the example microphone 110. As described above, the example microphone 110 is device that receives ambient audio. In some examples, the microphone 110 may be magnetic-coupling device (e.g., an induction coupling device, a loop coupling receiver, a telecoil receiver, etc.), and/or any device capable of receiving an audio signal. In such examples, the magnetic-coupling device may receive an audio signal (e.g., the example audio signal 106) wirelessly rather than acoustically. The example microphone 110 and the example meter 112 may be connected via a wired or wireless connection. In some examples, the example microphone 110 and the example meter 112 may be one device. For example, the example microphone 110 may be embedded in the example meter 112. The example meter 112 includes the example amplifier 114, the example AGC parameter determiner 118 and the example audio processor 116.

The example amplifier 114 of FIG. 1 obtains the electrical signal representative of the example audio 106 from the example microphone 110. The example amplifier 114 amplifies power and/or amplitude the electrical signal using a gain level. The example audio processor 116 can adjust the gain level from any value between a maximum gain of the amplifier 114 to a minimum gain of the amplifier 114. The maximum gain and minimum gain of the amplifier 114 depend on the hardware characteristics of the amplifier 114.

The example audio processor 116 of FIG. 1 processes audio based on the amplified electrical signal. As described above, if the electrical signal is amplified too much, clipping can occur which reduces the effectiveness of signature generation and/or watermark extraction. However, if the electrical signal is amplified too little, the electrical signal is not powerful enough for the audio processor 116 to generate a signature and/or extract a watermark. Accordingly, the example audio processor 116 perform an AGC protocol to adjust the gain of the amplifier 114 to attempt to select the highest, or a sufficiently high, gain for the amplifier 114 that does not result in clipping. The AGC protocol may include starting the amplifier 114 at a starting gain level where clipping is occurring, decreasing the gain until the clipping ceases. In some examples, the audio processor 116 may perform other types of AGC protocols. For example, the audio processor 116 may start at a gain level where clipping doesn't occur, and increase the gain until clipping occurs to determine the highest, or a high, gain level before clipping begins to occur. The example audio processor 116 adjusts the gains during the AGC protocol based on the AGC parameters generated by the example AGC parameter determiner 118. The AGC parameters may correspond to the starting gain level to use during the AGC protocol and/or the range of gain levels to use during the ramping of the AGC protocol.

The example AGC parameter determiner 118 of FIG. 1 runs an AGC parameter protocol to determine AGC parameters for an AGC protocol. The AGC parameters may be, for example, an initial gain level and/or a range of gain levels to use during the AGC protocol. The example AGC parameter determiner 118 has two or more tuners that can be tuned to two or more different ranges of gain levels. When an AGC protocol is to be performed, the example AGC parameter determiner 118 runs the AGC parameter protocol by processing audio using the two or more tuners to determine if clipping has occurred at the two or more different ranges of gain levels. In some examples, the example AGC parameter determiner 118 selects the lowest range of gain levels where clipping occurs and sends the range of gain levels as AGC parameters for the audio processor 116 to use in the AGC protocol. In this manner, the audio processor 116 will perform the AGC protocol on a smaller range of gain levels then the full range of gains that the amplifier 114 is capable of operating at, thereby increasing the speed of the AGC protocol and conserving resources needed to perform the AGC protocol. In some examples, the AGC parameter determiner 118 determines the highest gain level (e.g., or lowest, depending on the AGC protocol) from the selected range of gain levels and sends the highest (or lowest) gain level as an AGC parameter for the audio processor 116 to use in the AGC protocol as an initial gain level. Additionally or alternatively, the example AGC parameter determiner 118 may determine parameters for different types of protocols, such as sound pressure algorithms.

In some examples, the AGC parameter determiner 118 of FIG. 1 performs an iterative process where the selected range of gain levels is used to tune the tuners of the AGC parameter determiner 118 for a second iteration of the AGC protocol to further narrow the range of gain levels. For example, the AGC parameter determiner 118 may perform a first iteration of the AGC parameter protocol based on convergence of a geometric series by having a first tuner to amplify a sample the audio signal 106 using gains from 100 decibels (dB) to 50 dB and a second tuner to amplify the sample of the audio signal 106 using gains from 49 dB to 0 dB. If the example AGC parameter determiner 118 determines that clipping occurs in the 100-50 dB range but does not occur in the 49-0 dB range, the example AGC parameter determiner 118 may obtain a subsequent sample of the audio signal 106 and tune the first tuner to amplify the subsequent sample using gains from 100-75 dB and tune the second tuner to amplify the subsequent sample using gains from 74-50 dB and determine if clipping occurs within either range. The example AGC parameter determiner 118 may continue this iterative process based on a threshold number of iterations defined by a user and/or manufacturer. A higher number of iterations corresponds to a smaller range of gain levels for the AGC protocol. However, a higher number of iterations requires additional time and resources. The example AGC parameter determiner 118 is further described below in conjunction with FIG. 2.

Figure 2:
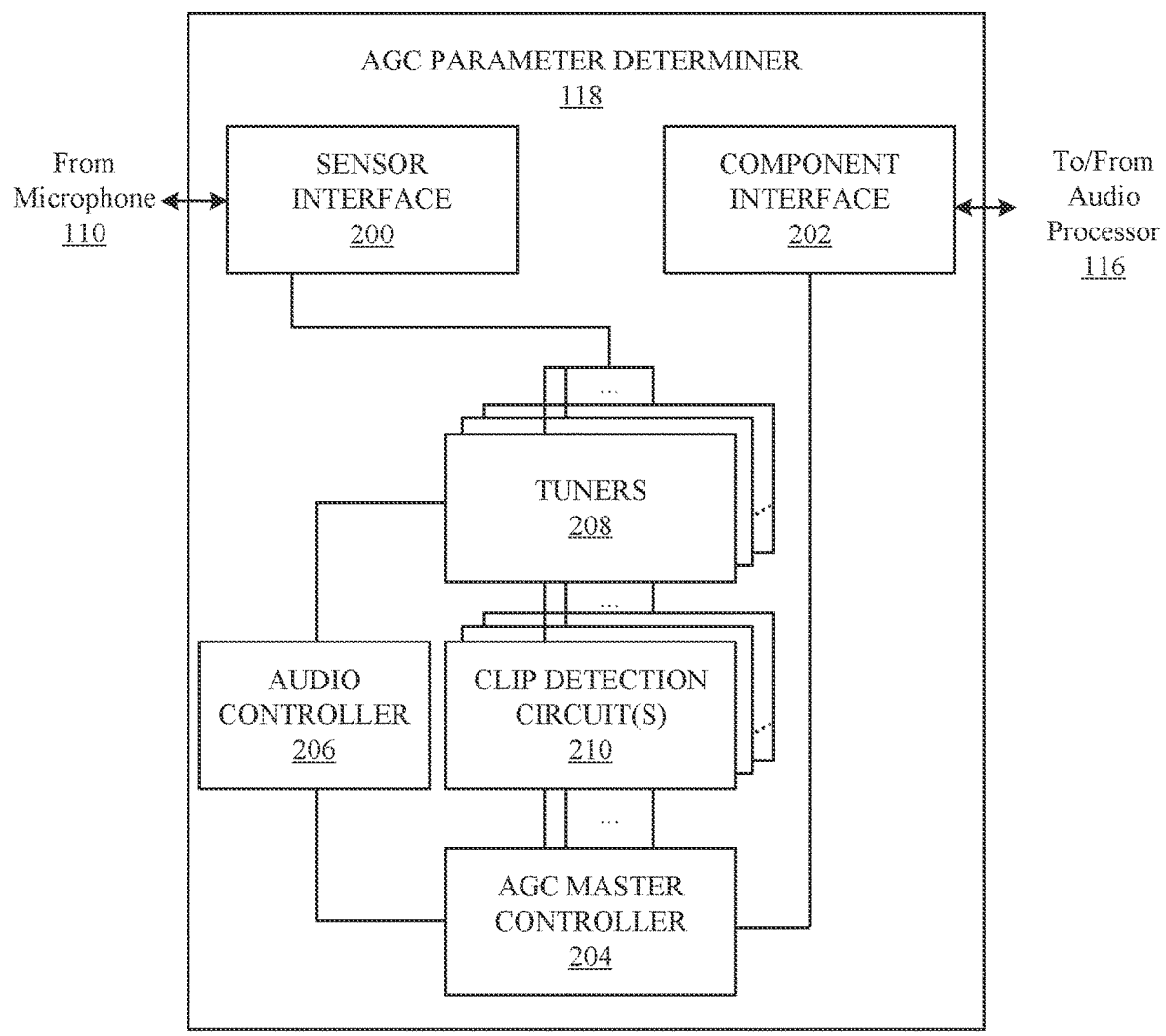
FIG. 2 is a block diagram of the example AGC parameter determiner of FIG. 1.

FIG. 2 is a block diagram of a implementation of the example AGC parameter determiner 118 of FIG. 1, disclosed herein, to determine AGC parameter(s) for a AGC protocol. While the example AGC parameter determiner 118 is described in conjunction with the example meter 112 and media output device 102 of FIG. 1, the example AGC parameter determiner 118 may be utilized to in conjunction with any type of meter and/or media output device. The example AGC parameter determiner 118 of FIG. 2 includes an example sensor interface 200, an example component interface 202, an example AGC master controller 204, an example audio controller 206, example tuners 208, and one or more example clip detection circuit(s) 210.

The example sensor interface 200 of FIG. 2 receives the electrical signal representative of the example audio signal 106 from the example microphone 110. The example sensor interface 200 sends the electrical signals to the example tuners 208. The example component interface 202 interfaces with the example audio processor 116 and/or any other component of the example meter 112. For example, the component interface 202 receives instructions from the example audio processor 116 to generate AGC parameter(s) for an upcoming AGC protocol. After the AGC parameter(s) are selected (e.g., determined), the example component interface 202 transmits the selected AGC parameter(s) to the example audio processor 116.

The example AGC master controller 204 of FIG. 2 obtains instructions and/or a trigger to select AGC parameters for an upcoming AGC protocol. For example, the AGC master controller 204 may obtain (e.g., from the audio processor 116 via the example component interface 202) instructions to identify an initial gain level or a range of gain levels to perform the AGC protocol. Additionally or alternatively, the AGC master controller 204 may determine that AGC parameters are needed based on a duration of time (e.g., the AGC protocol is performed after the threshold amount of time). The example AGC master controller 204 instructs the example audio controller 206 to adjust the example tuners 208 to tune to a particular gain level representative of a gain range. For example, if there are two tuners, the example AGC master controller 204 may split the full range of gains (e.g., 100-0 dB) into two halves. In such an example, the example AGC master controller 204 may instruct the example audio controller 206 to tune the first tuner to 100 dB (e.g., the maximum gain of the 100-50 dB half of the full range) and the second tuner to 49 dB (e.g., the maximum gain of the 49-0 dB). In this manner, if the example AGC master controller 204 determines that clipping occurred at 100 dB but did not occur at 49 dB, the AGC master controller 204 determines that the border between clipping and no clipping occurs between 100-50 dB. The example AGC master controller 204 receives the results from an iteration of the AGC parameter protocol from the example clip detection circuit(s) 210. In some examples, the AGC master controller 204 selects the AGC parameter(s) (e.g., an initial gain level or a range of gain levels to utilize in an AGC protocol) based on the results of the clip detection circuit(s) 210.

In some examples, the AGC master controller 204 of FIG. 2 may instruct the audio controller 206 to control the example tuners 208 to different gain levels representative of gain ranges for a subsequent iteration based on the results of the iteration. For example, if there are two tuners 208, the example AGC master controller 204 may instruct the audio controller 206 to tune the two example tuners 208 to different gain levels representative of halves of the total gain levels (e.g., 100 dB for the 100-50 dB range and 49 dB for the 49-0 dB range) that may be utilized by the example amplifier 114 of FIG. 1 (e.g., when the AGC parameter protocol is based on convergence of a geometric series). In such an example, in response to determining that clipping occurred at the 100 dB gain level representative of the first half (e.g., 100-50 dB) and not occurred at the 49 dB level representative of the second half (e.g., 49-0 dB), the example AGC master controller 204 may instruct the audio controller 206 to tune the two example tuners 208 to different gains representative of halves of the 100-50 dB range from the first iteration and perform a second iteration based on the new smaller halves. In other examples (e.g., when the AGC parameter protocol is not based on convergence of a geometric series), if there are two tuners 208, the example AGC master controller 204 may instruct the audio controller 206 to tune the two example tuners 208 to different gain levels representative of ranges of total gain levels (e.g., 100 dB for a 100-80 dB range and 79 dB for a 79-60 dB range) that may be utilized by the example amplifier 114 of FIG. 1. In such an example, if the example AGC master controller 204 determines that both gain levels representative of the respective ranges result in clipping, the example AGC master controller 204 may instruct the audio controller 206 to tune the two tuners 208 to two gain levels representative of different ranges (e.g., 59 dB for a 59-40 dB range and 39 dB for a 39-20 dB range) of the total gain levels that are different than used in the first iteration. The example AGC master controller 204 continues to perform subsequent iterations until the lowest gain range that includes clipping is determined (e.g., because the highest gain level without clipping occurs in the lowest gain range that includes clipping).

The example audio controller 206 of FIG. 2 receives instructions from the example AGC master controller 204 to tune the example tuner 208 to particular gain ranges. The example audio controller 206 tunes the example tuners 208 based on the instructions. In some examples, the audio controller 206 may be combined with the example AGC master controller 204. The example tuners 208 tune to the gain levels based on the audio controller 206 and amplify an obtained electrical signal corresponding to the audio signal 106 based on the gain levels. In some examples, the example audio controller 206 is instructed to control one of the tuners to amplify the electrical signal at the maximum gain level of the corresponding to the gain ranges (e.g., 100 dB for a 100-75 dB range). In other examples, if the example audio controller 206 is instructed to control one of the example tuners 208 to amplify an electrical signal from 100-50 dB, the audio controller 206 may start at the highest gain level of 100 dB and ramp the gain level down for a duration of time until the gain level is at the 50 dB gain level. The example tuners 208 may be any number of tuners (e.g., two or more).

An example clip detection circuit 210 of FIG. 2 is a circuit that processes electrical signals amplified by the example tuners 208 at different gain ranges in a duration of time and determines if clipping occurred within the duration of time (e.g., while the tuners 208 are tuned to their respective gain levels). When clipping occurs, an electrical signal with be flat for more than a threshold duration of time at some maximum level. Accordingly, the example clip detection circuit(s) 210 processes the amplified electrical signals to identify clipping based on a flat signal at a maximum level. If clipping occurs, the example clip detection circuit(s) 210 identifies the clipping in conjunction with the range of gain levels to the example AGC master controller 204. If clipping does not occur, the example clip detection circuit(s) 210 identifies that the signal was not clipped in conjunction with the range of gain levels. The example clip detection circuit(s) 210 may be multiple clip detection circuits (e.g., a clip detection circuit for each tuner) or may be a single circuit that determines if clipping occurs for the example tuners 208.

While an example manner of implementing the example meter 112 is illustrated in FIG. 1 and an example manner of implementing the example AGC parameter determiner 118 of FIG. 1 is illustrated in FIG. 2, one or more of the elements, processes and/or devices illustrated in FIG. 2 may be combined, divided, re-arranged, omitted, eliminated and/or implemented in any other way. Further, the example amplifier 114, the example audio processor, the example AGC parameter determiner 118, and/or, more generally, the example meter 112 of FIG. 1 and the example sensor interface 200, the example component interface 202, the example AGC master controller 204, the example audio controller 206, the example tuners 208, the example clip detection circuit(s) 210, and/or, more generally, the example AGC parameter determiner 118 of FIG. 2 may be implemented by hardware, software, firmware and/or any combination of hardware, software and/or firmware. Thus, for example, any of the example amplifier 114, the example audio processor, the example AGC parameter determiner 118, and/or, more generally, the example meter 112 of FIG. 1 and the example sensor interface 200, the example component interface 202, the example AGC master controller 204, the example audio controller 206, the example tuners 208, the example clip detection circuit(s) 210, and/or, more generally, the example AGC parameter determiner 118 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example amplifier 114, the example audio processor, the example AGC parameter determiner 118, and/or, more generally, the example meter 112 of FIG. 1 and the example sensor interface 200, the example component interface 202, the example AGC master controller 204, the example audio controller 206, the example tuners 208, the example clip detection circuit(s) 210, and/or, more generally, the example AGC parameter determiner 118 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example meter 112 of FIG. 1 and/or the example AGC parameter determiner 118 of FIG. 2 may include one or more elements, processes and/or devices in addition to, or instead of, those illustrated in FIGS. 1 and/or 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
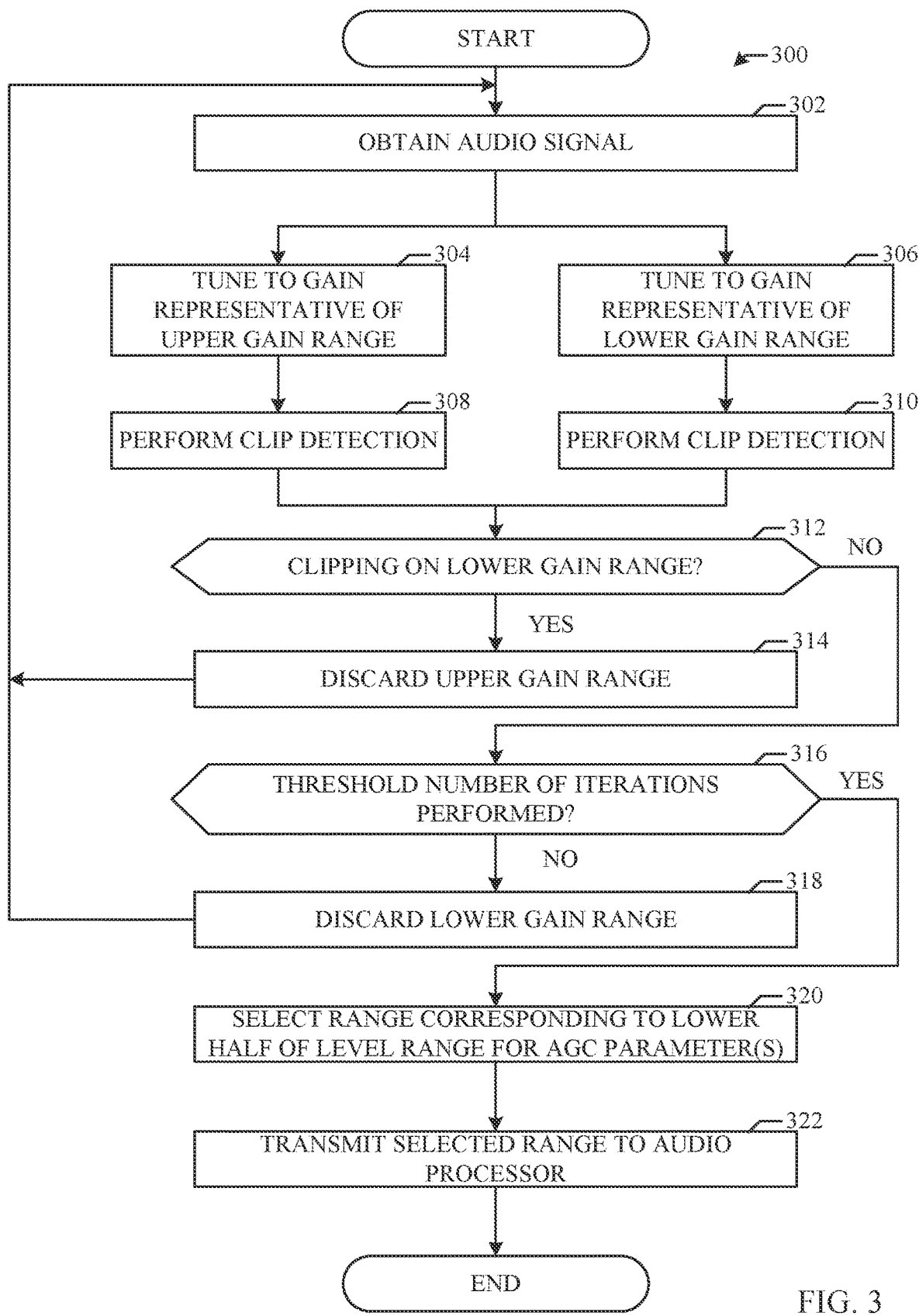
FIGS. 3-4 are flowcharts representative of example machine readable instructions that may be executed to implement the example AGC parameter determiner of FIGS. 1 and 2 to determine AGC parameter(s) for an AGC protocol.
Figure 4:
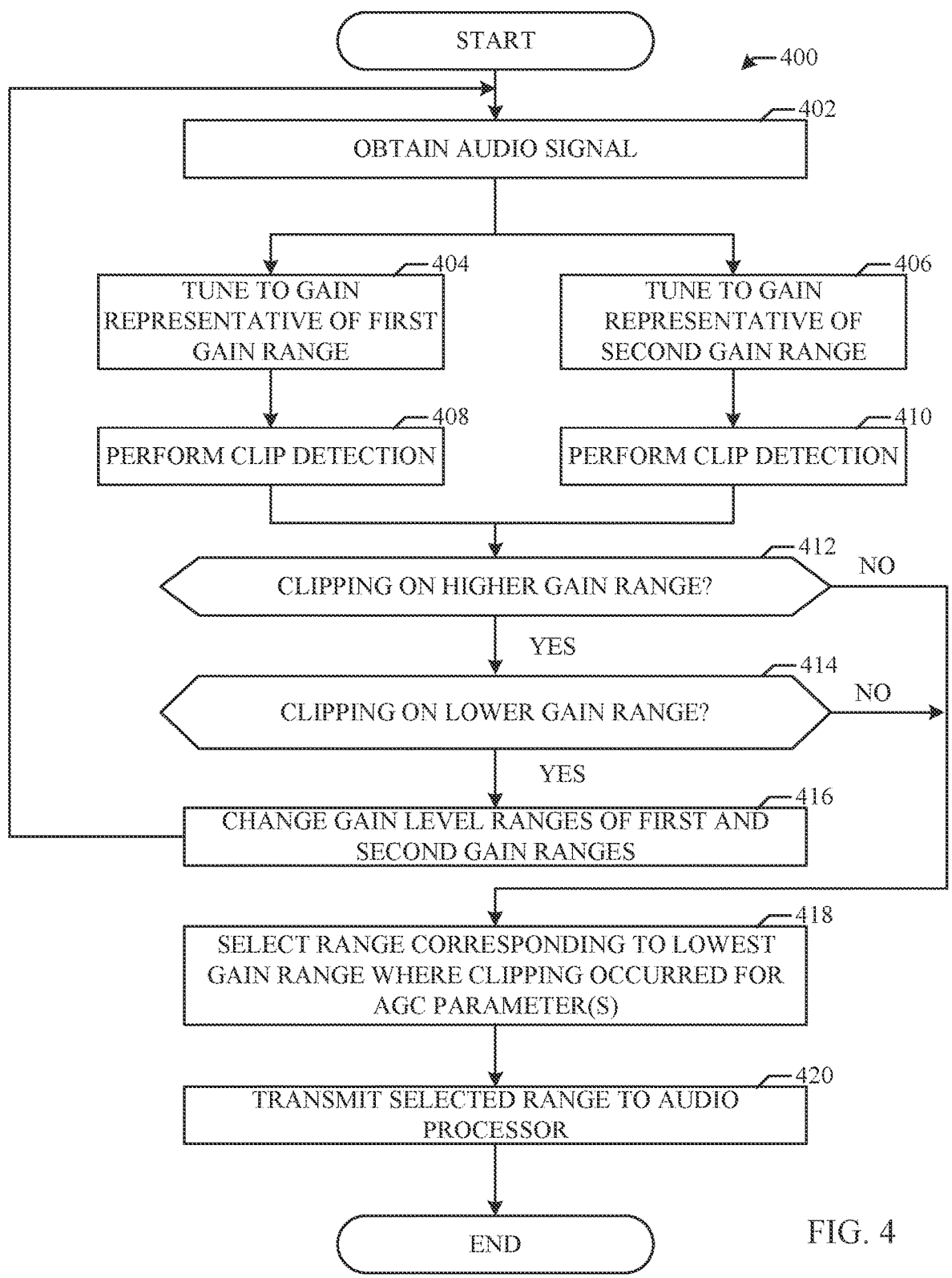

Flowcharts representative of example hardware logic, machine readable instructions, hardware implemented state machines, and/or any combination thereof for implementing the example AGC parameter determiner 118 of FIG. 2 are shown in FIGS. 3-4. The machine readable instructions may be one or more executable programs or portion(s) of an executable program for execution by a computer processor such as the processor 512 shown in the example processor platform 500 discussed below in connection with FIG. 5. The program may be embodied in software stored on a non-transitory computer readable storage medium such as a CD-ROM, a floppy disk, a hard drive, a DVD, a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowcharts illustrated in FIGS. 3-4, many other methods of implementing the example AGC parameter determiner 118 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined from a set of executable instructions that implement a program such as that described herein. In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

As mentioned above, the example processes of FIGS. 3-4 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

FIG. 3 is an example flowchart 300 representative of example machine readable instructions that may be executed by the example AGC parameter determiner 118 of FIGS. 1 and 2 to select AGC parameters for an AGC protocol based on convergence of a geometric series. Although the instructions of FIG. 3 are described in conjunction with the example meter 112, microphone 110, media output device 102, and AGC parameter determiner 118 of FIGS. 1 and 2, the example instructions may be utilized by any type of meter, microphone, media output device, and/or AGC parameter determiner. Although the example flowchart 300 of FIG. 3 is described in conjunction with AGC gain levels, the flowchart 300 may be described in conjunction with other attributes, such as sound pressure algorithms. The example flowchart 300 is described in conjunction with the example AGC parameter determiner 118 having two tuners 208. However, the example flowchart 300 may be described in conjunction with AGC parameter determiners with any number of tuners.

At block 302, the example sensor interface 200 obtains an audio signal (e.g., an electrical signal representative of the example audio signal 106 of FIG. 1) from the example microphone 110. At block 304, the example audio controller 206 tunes a first one of the example tuners 208 to a first gain representative an upper range of gain levels (e.g., 100 dB from the upper range of 100-50 dB). At block 306 (e.g., at the same time), the example audio controller 206 tunes a second one of the example tuners 208 to a second gain representative of a lower range of gain levels different than the first range of gain levels (e.g., 49 dB for the lower range of 49-0 dB). Alternatively, the audio controller 206 may tune the first tuner to the highest gain of the first gain range and gradually decrease the gain level to the lowest gain of the first gain range to allow the example clip detection circuit(s) 210 to determine whether clipping occurs within the gain range. At blocks 308, 310, the example clip detection circuit(s) 210 perform(s) clip detection on the output of the respective tuners 208 (e.g., tuned to the different half of gain levels) to determine if clipping occurs within the respective gain ranges. The example clip detection circuit(s) 210 determine(s) if the respective signals have been clipped based on whether the signal is flat at a maximum level for more than a threshold duration of time, as described above in conjunction with FIG. 2.

At block 312, the example AGC master controller 204 determines if clipping has occurred in the lower gain range (e.g., based on the results of the example clip detection circuit(s) 210 for the maximum gain of the lower gain range). If the example AGC master controller 204 determines that clipping has occurred on the lower gain range (block 312: YES), the example AGC master controller 204 discards the upper gain range (block 314) and control returns to block 302 to perform a subsequent iteration by splitting the lower gain range into an upper gain range and a lower gain range. If the example AGC master controller 204 determines that clipping has not occurred on the lower gain range (block 312: NO), the example AGC master controller 204 determines if a threshold number of iterations has been performed (block 316). If the example AGC master controller 204 determines that the threshold number of iterations has not been performed (block 316: NO), the example AGC master controller 204 discards the lower gain range (block 318) and control returns to block 302 to perform a subsequent iteration by splitting the upper gain range into an upper gain range and a lower gain range. If the example AGC master controller 204 determines that the threshold number of iterations has been performed (block 316: YES), the example AGC master controller 204 selects the gain range corresponding to the lower half of the gain range for the AGC parameters (block 320). At block 322, the example component interface 202 transmits the selected range to the example audio processor 116. In this manner, the example audio processor 116 can perform the AGC protocol based on the selected gain range. In some examples, the AGC master controller 204 determines the maximum gain or the minimum gain (e.g., depending on how the AGC protocol is performed—from a low gain to a high gain or from a high gain to a low gain) of the selected gain range and send the maximum gain or minimum gain as the AGC parameter to the example audio processor 116. In this manner, the audio processor 116 can perform the AGC protocol using the maximum gain or minimum gain as an initial gain level for the AGC protocol.

FIG. 4 is an example flowchart 400 representative of example machine readable instructions that may be executed by the example AGC parameter determiner 118 of FIGS. 1 and 2 to select AGC parameters for an AGC protocol not based on convergence of a geometric series. Although the instructions of FIG. 4 are described in conjunction with the example meter 112, microphone 110, media output device 102, and AGC parameter determiner 118 of FIGS. 1 and 2, the example instructions may be utilized by any type of meter, microphone, media output device, and/or AGC parameter determiner. Although the example flowchart 400 of FIG. 4 is described in conjunction with AGC gain levels, the flowchart 400 may be described in conjunction with other attributes, such as sound pressure algorithms. The example flowchart 400 is described in conjunction with the example AGC parameter determiner 118 having two tuners 208. However, the example flowchart 400 may be described in conjunction with AGC parameter determiners with any number of tuners.

At block 402, the example sensor interface 200 obtains an audio signal (e.g., an electrical signal representative of the example audio signal 106 of FIG. 1) from the example microphone 110. At block 404, the example audio controller 206 tunes a first one of the example tuners 208 to a first gain level representative a first gain range (e.g., 100 dB for the 100-80 dB range) of the total gain levels (e.g., 100-0 dB). At block 406 (e.g., at the same time), the example audio controller 206 tunes a second one of the example tuners 208 to a second gain level representative of a second range of gain levels (e.g., 79 dB of the 79-60 dB range) different than the first range of gain levels. Alternatively, the example audio controller 206 may tune the first tuner to the highest gain of the first gain range and gradually decrease the gain level to the lowest gain of the first gain range to allow the example clip detection circuit(s) 210 to determine whether clipping occurs within the gain range. At blocks 408, 410, the example clip detection circuit(s) 210 perform(s) clip detection on the output of the respective tuners 208 (e.g., tuned to the different ranges of gain levels) to determine if clipping occurs within the respective gain ranges. The example clip detection circuit(s) 210 determine(s) if the respective signals have been clipped based on whether the signal is flat at a maximum level for more than a threshold duration of time, as described above in conjunction with FIG. 2.

At block 412, the example AGC master controller 204 determines if clipping has occurred in the higher gain range (e.g., 100-80 dB) (e.g., based on the results of the example clip detection circuit(s) 210 for the maximum gain of the lower gain range). If the example AGC master controller 204 determines that clipping has not occurred on the higher gain range (block 412: NO), control continues to block 418, as further described below. If the example AGC master controller 204 determines that clipping has occurred on the higher gain range (block 412: YES), the example AGC master controller 204 determines if clipping has occurred on the lower gain range (e.g., 79-60 dB) (e.g., based on the results of the example clip detection circuit(s) 210) (block 414). If the example AGC master controller 204 determines that clipping has not occurred on the lower gain range (block 414: NO), control continues to block 418, as further described below. If the example AGC master controller 204 determines that clipping has occurred on the lower gain range (block 414: YES), the example AGC master controller 204 changes the gain ranges of the first and second gain ranges (e.g., to a third gain range of 59-40 dB and a fourth gain range of 39-20 dB) (block 416) and control returns to block 402 to perform a second iteration based on the adjusted gain ranges.

At block 418 the example AGC master controller 204 selects the gain range corresponding to the lowest gain where clipping occurred for the AGC parameter(s). For example, if, during one or more iterations, the example AGC master controller 204 determines that the lowest range level where clipping occurred was from 79-60 dB, the example AGC master controller 204 selects the 79-60 dB gain range as the AGC parameters to be used in the AGC protocol. At block 420, the example component interface 202 transmits the selected range to the example audio processor 116. In this manner, the example audio processor 116 can perform the AGC protocol based on the selected gain range. In some examples, the AGC master controller 204 determines the maximum gain or the minimum gain (e.g., depending on how the AGC protocol is performed—from a low gain to a high gain or from a high gain to a low gain) of the selected gain range and send the maximum gain or minimum gain as the AGC parameter to the example audio processor 116. In this manner, the audio processor 116 can perform the AGC protocol using the maximum gain or minimum gain as an initial gain level for the AGC protocol.

Figure 5:
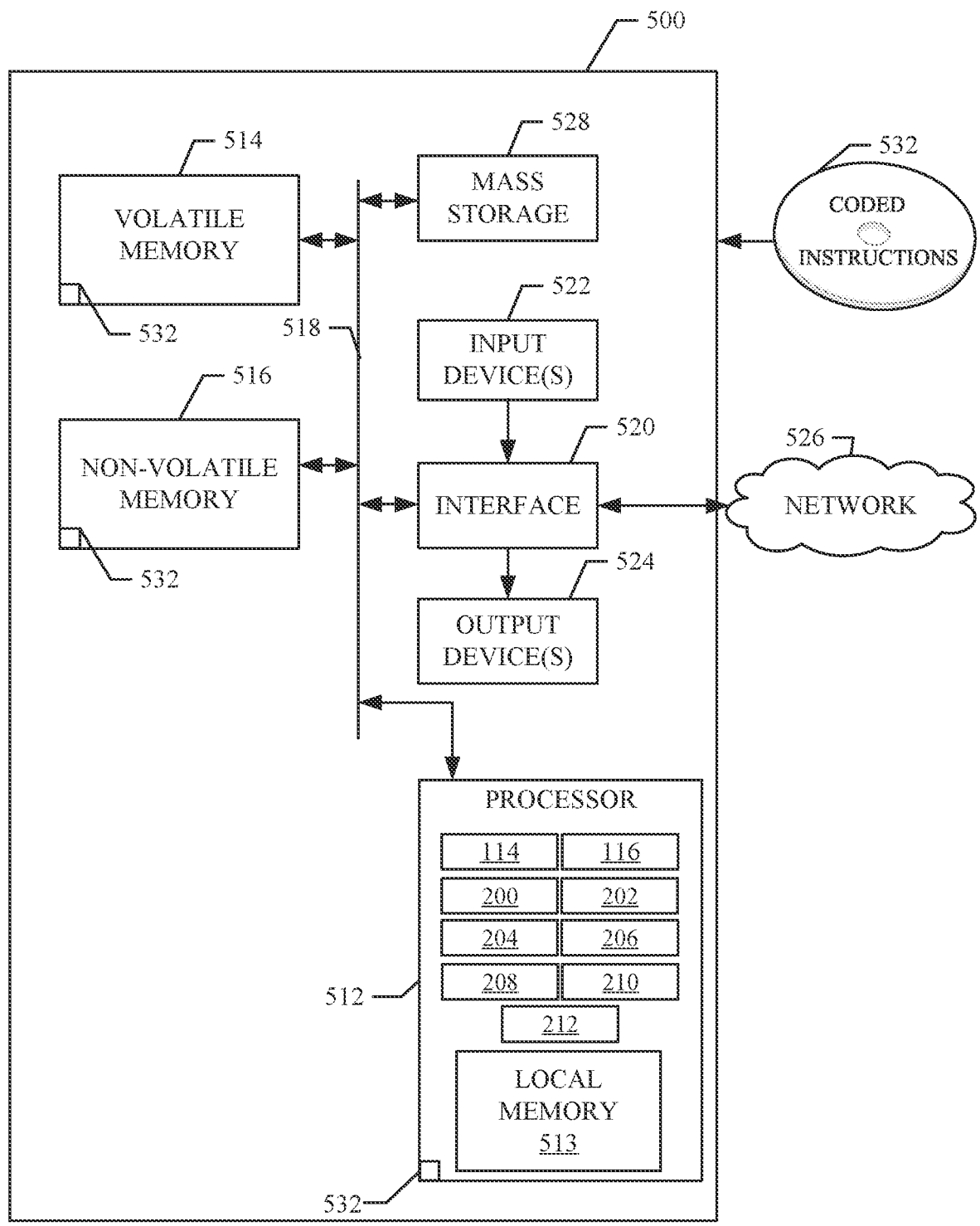
FIG. 5 is a block diagram of a processor platform structured to execute the example machine readable instructions of FIGS. 3-4 to control the example AGC parameter determiner of FIGS. 1 and 2.

FIG. 5 is a block diagram of an example processor platform 500 structured to execute the instructions of FIGS. 3-4 to implement the meter 112 of FIG. 1 and/or the example AGC parameter determiner 118 of FIG. 2. The processor platform 500 can be, for example, a server, a personal computer, a mobile device (e.g., a cell phone, a smart phone, a tablet such as an iPad™), a personal digital assistant (PDA), an Internet appliance, a gaming console, a personal video recorder, a set top box, an audio meter, a personal people meter, a headset or other wearable device, or any other type of computing device.

The processor platform 500 of the illustrated example includes a processor 512. The processor 512 of the illustrated example is hardware. For example, the processor 512 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example amplifier 114, the example audio processor 116, the example sensor interface 200, the example component interface 202, the example AGC master controller 204, the example audio controller 206, the example tuners 208, and/or the example clip detection circuit(s) 210 of FIGS. 1 and/or 2.

The processor 512 of the illustrated example includes a local memory 513 (e.g., a cache). The processor 512 of the illustrated example is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 516 may be implemented by flash memory and/or any other desired type of memory device. Access to the main memory 514, 516 is controlled by a memory controller.

The processor platform 500 of the illustrated example also includes an interface circuit 520. The interface circuit 520 may be implemented by any type of interface standard, such as an Ethernet interface, a universal serial bus (USB), a Bluetooth® interface, a near field communication (NFC) interface, and/or a PCI express interface.

In the illustrated example, one or more input devices 522 are connected to the interface circuit 520. The input device(s) 522 permit(s) a user to enter data and/or commands into the processor 512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 524 are also connected to the interface circuit 520 of the illustrated example. The output devices 524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 520 of the illustrated example, thus, typically includes a graphics driver card, a graphics driver chip and/or a graphics driver processor.

The interface circuit 520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 500 of the illustrated example also includes one or more mass storage devices 528 for storing software and/or data. Examples of such mass storage devices 528 include floppy disk drives, hard drive disks, compact disk drives, Blu-ray disk drives, redundant array of independent disks (RAID) systems, and digital versatile disk (DVD) drives.

The machine executable instructions 532 of FIGS. 3-4 may be stored in the mass storage device 528, in the volatile memory 514, in the non-volatile memory 516, and/or on a removable non-transitory computer readable storage medium such as a CD or DVD.

From the foregoing, it will be appreciated that example methods, apparatus and articles of manufacture have been disclosed that determine automated gain control parameters for an automated gain control protocol. The disclosed methods, apparatus and articles of manufacture improve the efficiency of using a computing device by decreasing the total number of gain levels needed during an AGC protocol to determine the optimal gain level. For example, instead of performing an AGC protocol that starts at the highest gain of an amplifier and/or is performed across the full range of the amplifier, the AGC parameter protocol can set the starting gain level and/or range of gain value for the AGC protocol to result in a reduction of time and resources for the AGC protocol. The disclosed methods, apparatus and articles of manufacture are accordingly directed to one or more improvement(s) in the functioning of a computer.

Although certain example methods, apparatus and articles of manufacture have been described herein, other implementations are possible. The scope of coverage of this patent is not limited thereto. On the contrary, this patent covers all methods, apparatus and articles of manufacture fairly falling within the scope of the claims of this patent.

What is claimed is:

1. An apparatus comprising:
at least one memory;
computer readable instructions; and
processor circuitry to execute the computer readable instruction to:
cause a first tuner to apply a first gain to an input audio signal to generate a first amplified audio signal; and
cause a second tuner to apply a second gain lower than the first gain to the input audio signal to generate a second amplified audio signal; and
select a range of gains corresponding to the first gain for an automated gain control protocol in response to the first amplified audio signal exhibiting clipping and the second amplified audio signal not exhibiting clipping.

2. The apparatus of claim 1, wherein the range of gains is a first range of gains, the first gain is a maximum gain of the first range of gains and the second gain is a maximum gain of a second range of gains.

3. The apparatus of claim 1, wherein the processor circuitry is to:
detect whether the first amplified audio signal exhibited clipping while the first tuner applied the first gain; and
detect whether the second amplified audio signal exhibited clipping while the second tuner applied the second gain.

4. The apparatus of claim 1, wherein the processor circuitry is to cause the first tuner to apply the first gain and the second tuner to apply the second gain in a second iteration after a first iteration in which the first tuner applied a third gain and the second tuner applied a fourth gain during, the fourth gain lower than the third gain, the third gain different from the first gain and the second gain different from the fourth gain.

5. The apparatus of claim 4, wherein the processor circuitry is to:
for the first iteration before the second iteration:
cause the first tuner to apply the third gain to the input audio signal to generate a third amplified audio signal; and
cause the second tuner to apply the fourth gain to the input audio signal to generate a fourth amplified audio signal; and
in response to clipping of at least one of the third amplified audio signal or the fourth amplified audio signal, (A) cause the first tuner to apply the first gain and (B) cause the second tuner to apply the second gain for the second iteration.

6. The apparatus of claim 1, wherein the range of gains is a first range of gains and the automated gain control protocol supports a third range of gains, the third range of gains including the first range of gains and a second range of gains corresponding to the second gain.

7. The apparatus of claim 6, wherein the first range of gains is mutually exclusive of the second range of gains.

8. A non-transitory computer readable medium comprising instructions which, when executed, cause one or more processors to at least:
cause a first tuner to apply a first gain to an input audio signal to generate a first amplified audio signal; and
cause a second tuner to apply a second gain lower than the first gain to the input audio signal to generate a second amplified audio signal; and
select a range of gains corresponding to the first gain for an automated gain control protocol in response to the first amplified audio signal exhibiting clipping and the second amplified audio signal not exhibiting clipping.

9. The non-transitory computer readable medium of claim 8, wherein the range of gains is a first range of gains, the first gain is a maximum gain of the first range of gains and the second gain is a maximum gain of a second range of gains.

10. The non-transitory computer readable medium of claim 8, wherein the instructions cause the one or more processors to:
detect whether the first amplified audio signal exhibited clipping while the first tuner applied the first gain; and
detect whether the second amplified audio signal exhibited clipping while the second tuner applied the second gain.

11. The non-transitory computer readable medium of claim 8, wherein the instructions cause the one or more processors to cause the first tuner to apply the first gain and the second tuner to apply the second gain in a second iteration after a first iteration in which the first tuner applied a third gain and the second tuner applied a fourth gain, the fourth gain lower than the third gain the third gain different from the first gain and the second gain different from the fourth gain.

12. The non-transitory computer readable medium of claim 11, wherein the instructions cause the one or more processors to:
for the first iteration before the second iteration:
cause the first tuner to apply the third gain to the input audio signal to generate a third amplified audio signal; and cause the second tuner to apply the fourth gain to the input audio signal to generate a fourth amplified audio signal; and in response to clipping of at least one of the third amplified audio signal or the fourth amplified audio signal, (A) cause the first tuner to apply the first gain and (B) cause the second tuner to apply the second gain for the second iteration.

13. The non-transitory computer readable medium of claim 8, wherein the range of gains is a first range of gains and the automated gain control protocol supports a third range of gains, the third range of gains including the first range of gains and a second range of gains corresponding to the second gain.

14. The non-transitory computer readable medium of claim 13, wherein the first range of gains is mutually exclusive of the second range of gains.

15. A method comprising:

applying, using a first tuner, a first gain to an input audio signal to generate a first amplified audio signal; and applying, using a second tuner, a second gain lower than the first gain to the input audio signal to generate a second amplified audio signal; and selecting, by executing an instruction with one or more processor, a range of gains corresponding to the first gain for an automated gain control protocol in response to the first amplified audio signal exhibiting clipping and the second amplified audio signal not exhibiting clipping.

16. The method of claim 15, wherein the range of gains is a first range of gains, the first gain is a maximum gain of the first range of gains and the second gain is a maximum gain of a second range of gains.

17. The method of claim 15, further including:

detecting whether the first amplified audio signal exhibited clipping while the first tuner applied the first gain; and detecting whether the second amplified audio signal exhibited clipping while the second tuner applied the second gain.

18. The method of claim 15, wherein the first gain and the second gain are applied during a second iteration after a first iteration in which (a) the first tuner applied a third gain and the second tuner applied a fourth gain, the fourth gain lower than the third gain, the third gain different from the first gain and the second gain different from the fourth gain.

19. The method of claim 18, further including:

for the first iteration before the second iteration:

applying, with the first tuner, the third gain to the input audio signal to generate a third amplified audio signal; and applying, with the second tuner, the fourth gain to the input audio signal to generate a fourth amplified audio signal; and in response to clipping of at least one of the third amplified audio signal or the fourth amplified audio signal, (A) applying the first gain and (B) applying the second gain for the second iteration.

20. The method of claim 15, wherein the range of gains is a first range of gains and the automated gain control protocol supports a third range of gains, the third range of gains including the first range of gains and a second range of gains corresponding to the second gain.

* * * * *